United States Patent
Desmarais et al.

(10) Patent No.: US 10,038,948 B2
(45) Date of Patent: Jul. 31, 2018

(54) BATTERY CHARGING ADAPTOR FOR A WIRELESS MICROPHONE

(71) Applicants: Mark Desmarais, Northborough, MA (US); Timothy D Root, Nashua, NH (US)

(72) Inventors: Mark Desmarais, Northborough, MA (US); Timothy D Root, Nashua, NH (US)

(73) Assignee: Revo Labs

( * ) Notice: Subject to any disclaimer, the term of this patent is extended or adjusted under 35 U.S.C. 154(b) by 244 days.

(21) Appl. No.: 14/283,412

(22) Filed: May 21, 2014

(65) Prior Publication Data
US 2015/0341716 A1    Nov. 26, 2015

(51) Int. Cl.
| H04R 1/08 | (2006.01) |
| H02J 7/00 | (2006.01) |
| H04R 3/00 | (2006.01) |
| G01R 31/36 | (2006.01) |

(52) U.S. Cl.
CPC ............... H04R 1/08 (2013.01); G01R 31/36 (2013.01); G01R 31/362 (2013.01); H02J 7/0052 (2013.01); H04R 3/00 (2013.01); H02J 7/007 (2013.01); H04R 2410/00 (2013.01); H04R 2420/07 (2013.01)

(58) Field of Classification Search
CPC .......... H04R 1/08; H04R 3/00; H04R 1/1041; G01R 31/3624; H04M 1/6058; H02J 7/0055; H02J 7/0052; H02J 7/007
See application file for complete search history.

(56) References Cited

U.S. PATENT DOCUMENTS

| 5,600,224 A * | 2/1997 | Mody ..................... H02J 7/027 320/106 |
| 6,191,551 B1 * | 2/2001 | Fischer ................. H02J 7/0008 320/106 |
| 6,548,987 B1 * | 4/2003 | Oster ....................... H04R 1/08 320/114 |
| 7,151,910 B2 * | 12/2006 | Suzuki ................... H04R 1/083 381/74 |
| 8,362,747 B2 * | 1/2013 | Parish ................... H04M 19/08 320/114 |
| 8,744,087 B2 * | 6/2014 | Bodley .................... H04N 7/15 381/10 |
| 9,214,823 B1 * | 12/2015 | Koller ................... H02J 7/0047 |
| 9,601,938 B2 * | 3/2017 | Huang .................. H02J 7/0055 |

(Continued)

*Primary Examiner* — Fan Tsang
*Assistant Examiner* — Angelica M McKinney
(74) *Attorney, Agent, or Firm* — Robert Schuler

(57) ABSTRACT

An audio system has a base station and a plurality of wireless microphones that are associated with the base station. The wireless microphones operate to capture acoustic audio information and to transmit this audio information to the base station. Each of the wireless microphones operate to detect whether or not they are connected to an external voltage source. If any of the plurality of the wireless microphones determines that they are not connected to an external voltage source, then it is controlled to transition to a first operational state. Or if a wireless microphone determines that it is connected to an external voltage source, and depending upon the voltage level detected, the microphone can transition to either a second or a third operational state.

7 Claims, 4 Drawing Sheets

WIRELESS MICROPHONE 100

(56) References Cited

U.S. PATENT DOCUMENTS

| | | | | |
|---|---|---|---|---|
| 2001/0000423 | A1* | 4/2001 | Fischer | H02J 7/0031 320/114 |
| 2001/0055984 | A1* | 12/2001 | Kawasaki | H04B 1/08 455/569.1 |
| 2003/0146733 | A1* | 8/2003 | Miller | H02J 7/0008 320/106 |
| 2005/0040785 | A1* | 2/2005 | Barnes | G06F 1/263 320/101 |
| 2005/0099156 | A1* | 5/2005 | Brenner | H02J 7/0036 320/116 |
| 2009/0284216 | A1* | 11/2009 | Bessa | H02J 7/0044 320/101 |
| 2010/0057444 | A1* | 3/2010 | Cilia | G10L 19/012 704/201 |
| 2012/0187897 | A1* | 7/2012 | Lenk | H01M 10/44 320/101 |
| 2013/0020988 | A1* | 1/2013 | Kim | H02J 7/0013 320/108 |
| 2013/0057078 | A1* | 3/2013 | Lee | H02J 7/00 307/104 |
| 2014/0001849 | A1* | 1/2014 | Huang | H02J 7/0055 307/24 |
| 2014/0009120 | A1* | 1/2014 | Kim | H02J 7/0068 320/138 |
| 2014/0278393 | A1* | 9/2014 | Ivanov | G10L 15/20 704/233 |

\* cited by examiner

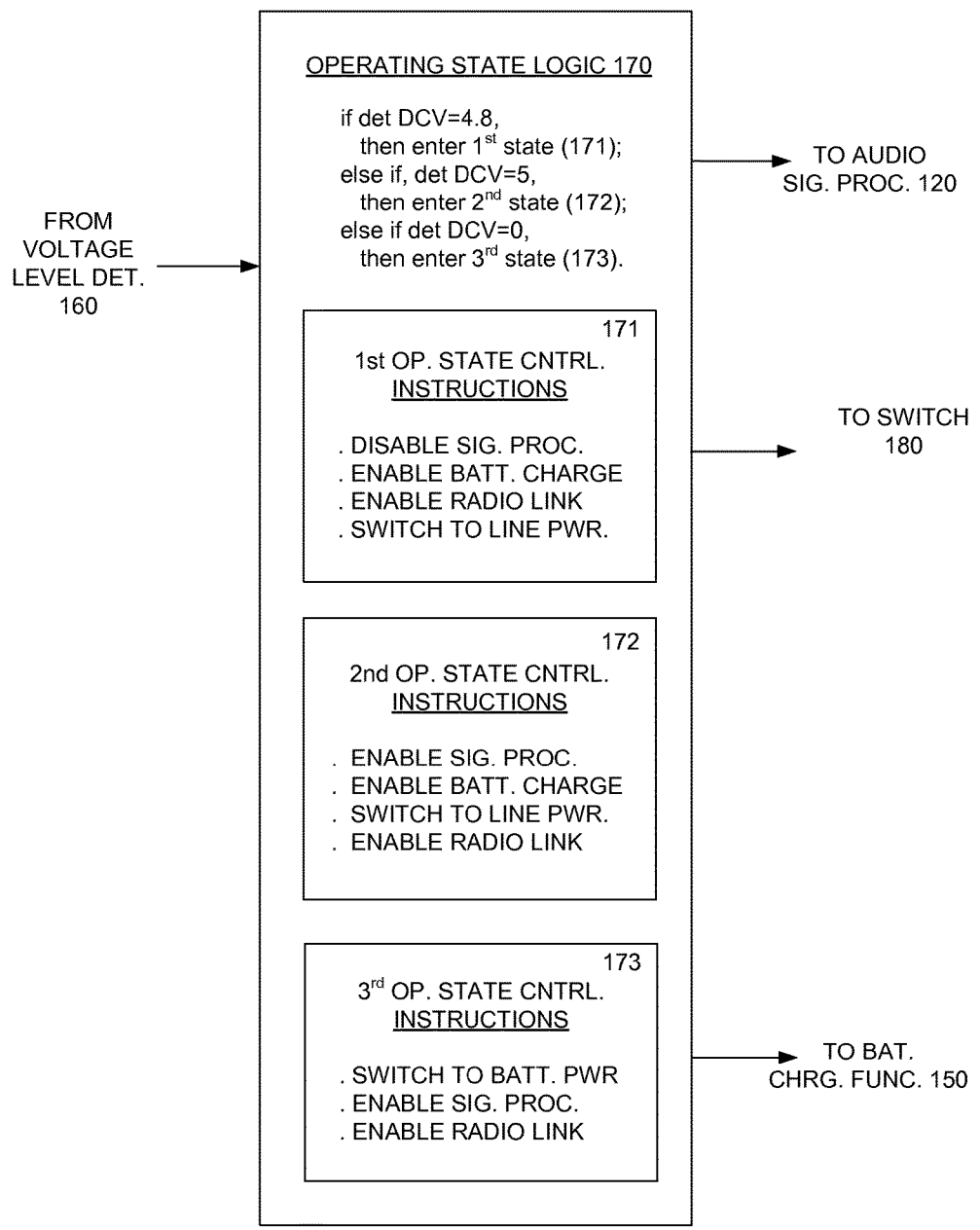

STANDARD CHARGE BASE 300

HYBRID CHARGE BASE 310

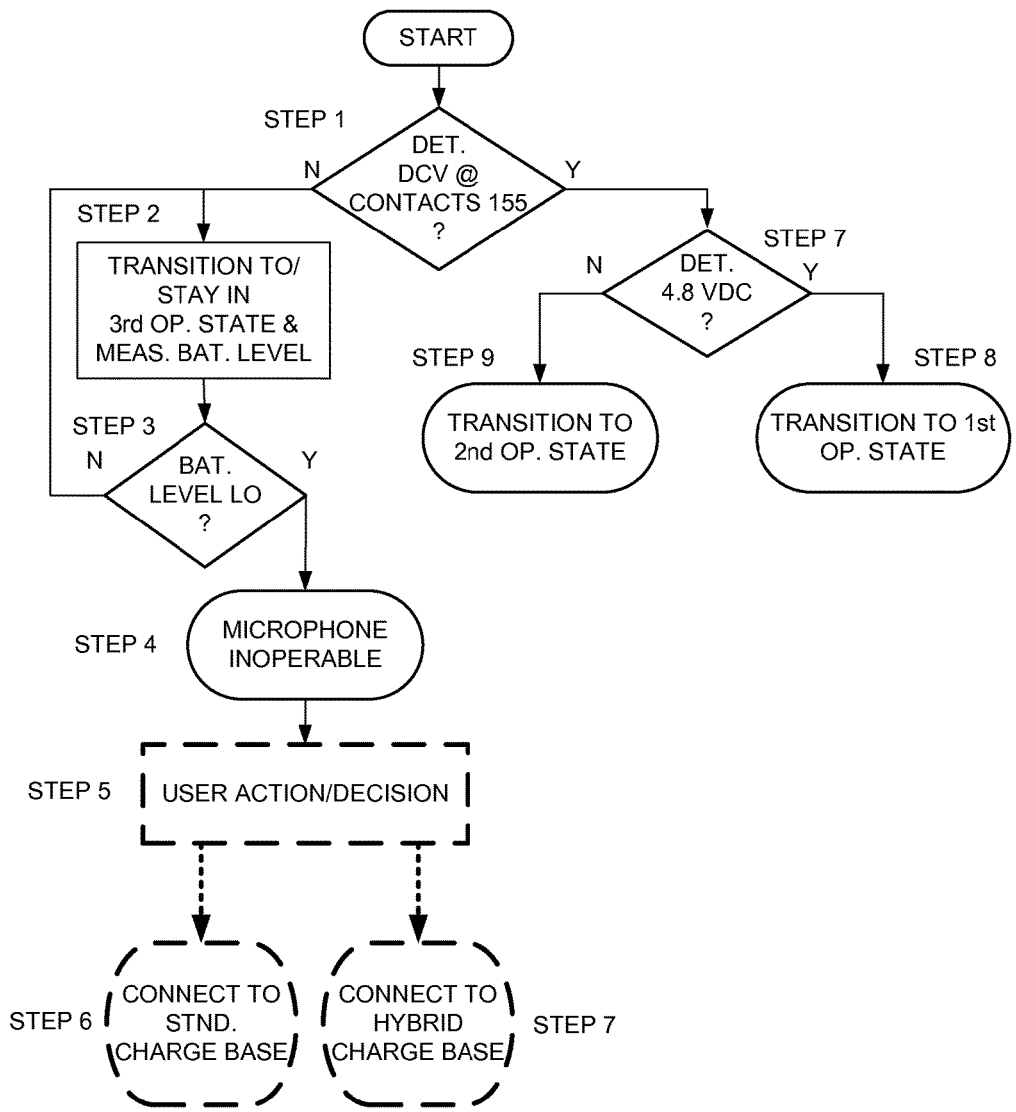

BATTERY CHARGING ADAPTOR FOR A WIRELESS MICROPHONE

1. FIELD OF THE INVENTION

The present disclosure describes a wireless microphone system that permits a microphone to be charging and in use at the same time.

2. BACKGROUND

Large meetings conducted either locally or in two separate locations with at least one of the locations involving two or more individuals can be facilitated using an audio system such as a room audio system or an audio conferencing system. Such audio systems typically include some number of wired or wireless microphones, at least one wired or wireless loudspeaker and a base station which can be connected to a local or wide area communication network. In such an audio system, microphones can operate to pick up acoustic energy corresponding to speech from a near side speaker and transmit audio signals to a base station which generally operates to provide session control and to process the audio signals in a number of ways before sending it to either a local loud speaker or to a remote audio conferencing device to be played. Among other things, the base station can be configured with functionality to amplify audio signals, to regulate microphone signal gain (automatic gain control or AGC), to suppress noise, and it can be controlled to mute an audio signal captured by one or more microphones associated with a local or remote audio system.

Audio systems that have wired microphones tend to artificially limit the seating arrangement of those who are participating in a meeting or conference call, or they can introduce a disorganized and unwanted mass of cables to the top of a meeting table. Wired microphones can be either attached to one position on a conference table (so that they cannot be moved) and connected to a base station by a signal/power cable (which can be arranged to be unobtrusive at best), or they are not be attached to a conference table and are connected to the base station by a length of cable. In the case where a microphone is attached to the conference, meeting participants are limited to sitting proximate to a microphone in order to be heard, and in the later case, while the microphone can be moved to accommodate a wider range of seating arrangements and the movement of the microphone on a table top is only limited by the length of the cable attaching it to the base station, each microphone of this type introduces a cable to the top of the meeting table, and depending upon the number of microphone in the audio system, the meeting table surface can quickly become cluttered with a disorganized mass of cables. The wire clutter and seating arrangement issues have been resolved by designing audio systems that support wireless microphones.

An audio system configured to support wireless microphones allows meeting participants the convenience of sitting in an optimal position around a conference table, thus allowing each participant to more effectively contribute to the meeting. Depending upon the role of a participant in meeting or audio conference session, they can be seated around a table or they can be free to move around the meeting room while carrying or wearing a wireless microphone. Being wireless, the microphones have to be recharged after each use or periodically as necessary, otherwise their batteries may not be charged to a level that permits them to power a microphone for the entire duration of a meeting. Wireless microphone batteries can be charged by placing each microphone into a charger base device after being used. This charger base may only function to recharge microphone batteries (DC power management function), or it may function to both recharge the batteries and have complex audio signal processing functionality such as acoustic echo cancellation (AEC) functionality, double talk detection functionality, audio gain level control to name only three. Typically, after a microphone is placed into such a charger base and the battery starts charging, the functionality in the microphone that operates to capture and process acoustic audio signals is deactivated.

3. BRIEF DESCRIPTION OF THE DRAWINGS

The present invention can be best understood by reading the specification with reference to the following figures, in which:

FIG. 2 illustrates operating state logic comprising the wireless microphone of FIG. 1.

FIG. 4 is a logical flow diagram illustrating the operation of the logic described with reference to FIG. 2.

4. DETAILED DESCRIPTION OF THE INVENTION

Figure 1:
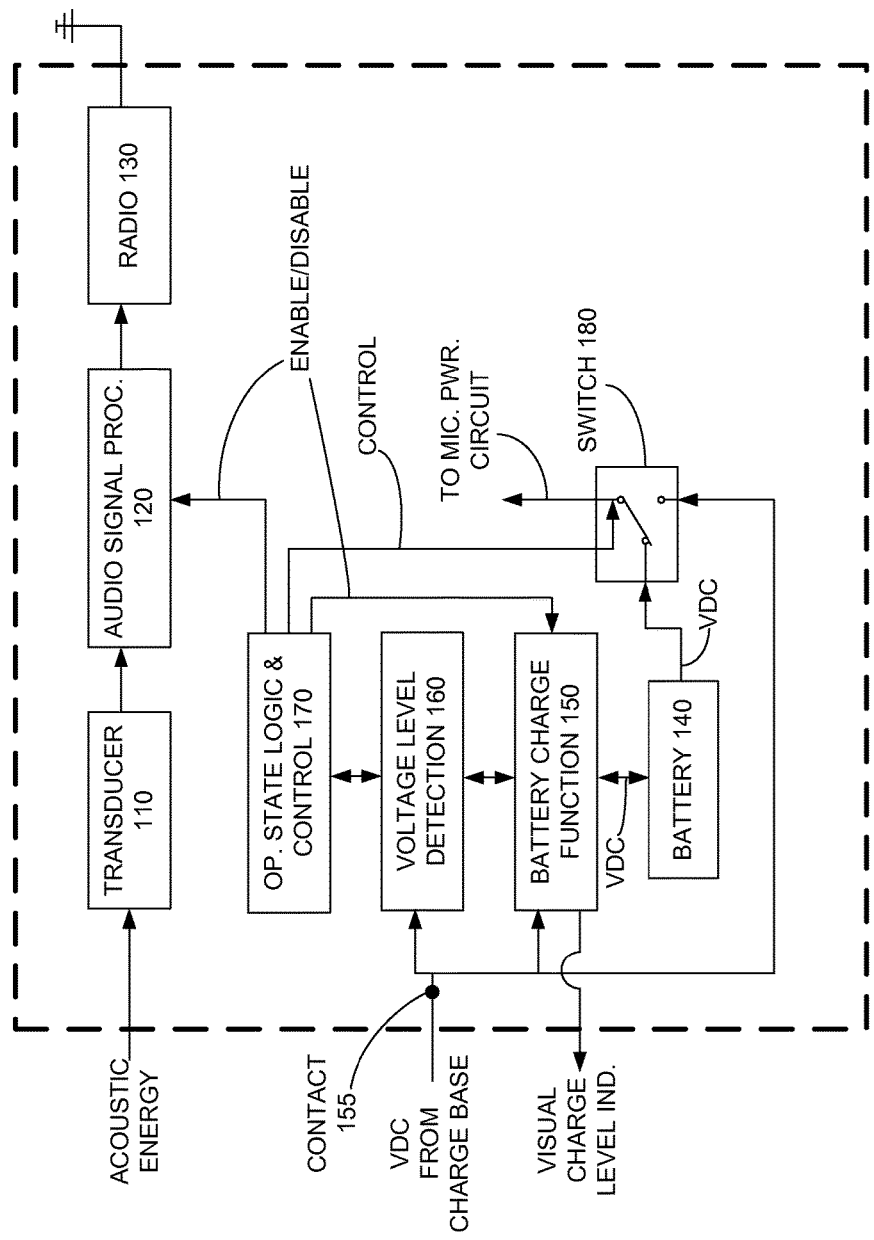
FIG. 1 illustrates functional elements comprising a wireless microphone 100.

Typically a stationary charge base used to charge two or more wireless microphone batteries has some functionality that regulates a DC (in this case) voltage that is applied to a wireless microphone connected to it. If, when connected to the charge base, the wireless microphone detects a voltage level that is substantially the same as the regulated voltage level, it can proceed to charge its battery or batteries. Also, during the time that the wireless microphone is connected to the charge base, and its batteries are being charged, the audio signal capture and signal processing functionality comprising the wireless microphone is not typically active, as there is no need for the audio signal processing functionality to be turned on if the microphone is not intended to be available for use (active signal processing in this state serves no purpose). Also, having the audio signal processing functionality remain active may lengthen the time it takes to charge the microphone batteries.

While audio systems that are designed to support wireless microphones are certainly convenient for meeting participants to use in as much as the participants are free to move around a meeting room while holding a microphone or position themselves around a meeting table optimally to participate in the meeting, at the conclusion of a meeting the participants very often inadvertently neglect to return their microphone to a charge base so that the microphone batteries recharge. Consequently, those microphones not returned to a charge base after use may not have sufficient battery life to operate for the duration of another audio session. In this case, the conduct of an audio session can be negatively impacted to the extent that the battery level in one or more wireless microphones drops below a minimum operational level.

In order to be sure that all of the wireless microphones associated with an audio system are able to process audio signals during the course of an audio session, we have designed a wireless microphone that is capable of entering any one of a plurality of operational states depending upon whether it is connected to a charge base device and depending upon the type of charge base device it is connected to. In this regard, our wireless microphone design has functionality that permits it to recognize whether it is connected to a charge base device, and to recognize what type of charge base device it is connected to. If the wireless microphone detects that it is connected to a first charge base type that generates a charging voltage that is regulated to be a voltage "X", then the microphone can enter into a first operational state in which it's audio signal processing functionality is disabled, it's transceiver is enabled and it initiates a battery charging process. If the wireless microphone detects that it is connected to a second charge base type that generates a charging voltage that is regulated to be either greater than the voltage X or less than the voltage X by some threshold voltage value, then the microphone can enter into a second operation state in which it's audio signal processing functionality is fully operational, it is configured to operate on battery power, it's transceiver is enabled and it initiates a battery charging process. If the wireless microphone is not connected to a charge base and it's battery level is greater than a minimum operating level, then the microphone can enter a third operational state in which it's audio signal processing functionality is fully operational. A wireless microphone designed with the capability of entering into any of the operational states described above is available for continuous use for the duration of one or multiple audio sessions.

The first charge base type is referred to hereinafter as a standard charge base, and the second charge base type is referred to hereinafter as a hybrid charge base. The standard charge base regulates it's DCV level output to be different than the regulated DCV level of the hybrid charge base. The current state or mode in which a wireless microphone is operating depends upon the charge base DCV level detected by the wireless microphone. If the wireless microphone detects a DCV level consistent with the standard charge base (4.8 VDC for instance), then the wireless microphone transitions to the first operational state in which its audio signal processing functionality is disabled, the battery charge function is enabled, the two-way radio link function is enabled and an external voltage source provided by the standard charge base is used to power the wireless microphone functionality (powers the radio using current from the standard charge base). If the wireless microphone detects a DCV level consistent with the hybrid charge base (5 VDC for instance), then it transitions to the second operational state in which it enables it's signal processing functionality, enables it's battery charge functionality, enables it's two-way radio link, and switches to the power sourced from the hybrid charge base to run its radio, signal processing and other functionality. If the wireless microphone does not detect any charge base voltage level, then it transitions to the third operational state. In this third state, the wireless microphone switches to battery power, enables its audio signal processing functionality and enables it's two-way radio link functionality. This very flexible operating arrangement allows the wireless microphone to be used by participants in an audio session, even if it's battery level is below an operational level, and allows the microphone to be positioned in an optimal location on a conference table to facilitate the audio portion of a meeting or conference.

Wireless microphones generally operate to receive acoustic energy from the environment in which they operate, to convert the acoustic energy to an analog audio signal that is sampled and converted into a digital audio signal for transmission to a base station. The base station can be associated with any audio system, such as an audio conferencing system, a room audio system, or any other type of system that benefits by supporting wireless microphones. FIG. 1 shows functionality comprising a wireless microphone 100 that can be associated with a base station (not shown) and which operates as described above. The microphone 100 has a transducer 110 that operates to capture acoustic audio energy from the environment in which it is operating, it has an audio signal processing function 120 (typically implemented in a digital signal processor) that operates to sample an analog audio signal and convert it to a digital audio signal, and it has a transceiver device 130 (i.e., DECT or some other radio technology) that operates to transmit the digitized audio signal information over the air to a base station and it operates to receive microphone control and other information from the base station.

All wireless microphones operate using power supplied by some form of a power storage device (i.e., rechargeable battery) that provides an appropriate current at an appropriate DC voltage level. As batteries need to be periodically charged to a specified operational voltage, wireless microphones have to be periodically connected to a standard charger base device. In this regard, the wireless microphone 100 has a rechargeable battery or batteries 140 (i.e., two AA rechargeable batteries) that are charged under the control of a battery charge function 150 when the microphone voltage level detection function 160 determines that the microphone is connected to either a standard or a hybrid charge base. The voltage level detection function 160 (can be a simple DC volt meter) operates to monitor a battery charge contact point or points 155 for a DC voltage level that is determined by an operational state logic module 170 to be the appropriate level to initiate a battery charging process. An indication of the DC voltage level detected by the function 160 is sent to the operational state logic 170 which determines whether or not the voltage level is an appropriate DC voltage for charging the wireless microphone batteries, and if so, the logic 170 enables the battery charge function 150 to initiate the battery charging process. The battery charge function 150 receives power from a charge base and applies a regulated DC voltage (3 VDC if two AA batteries are used to power the microphone) at an appropriate current level to the microphone batteries, and the function 150 monitors the charge state of the battery and terminates the charging process at the point that the battery is charged to an operational level.

As described earlier, depending upon whether the wireless microphone 100 detects a voltage at the charge contact point 155, and depending upon the voltage level detected, the microphone 100 is designed to enter into any one of three operational states. In the first operational state, the wireless microphone 100 is connected to a standard charge base and is not enabled to receive and process audio information. In the second operational state, the wireless microphone 100 is connected via a flexible power cord (tether) to an external power source, is fully operational, and can be moved around during use which movement is only restricted by the length of the tether connecting it to the DC power source. In a third operational state, the wireless microphone 100 is not connected to any external power source, is fully operational and can be carried around by a user within range of the base station with which it is associated without any restriction.

The logic 170 implementing wireless microphone state changes is shown in block diagram form in FIG. 2. In operation, if the microphone detects a first DC voltage level (≈4.8 VDC) at its charge contact point 155, then it enters a first operational state by executing instructions included in block 171 in which the audio signal processing functionality 120 is disabled, the two-way radio link is enable, the battery charge function 150 is enabled to initiate a battery charging process or cycle and the switch 180 is controlled so that power to run the radio is received from the charge base. If the microphone detects a second DC voltage level ($\approx$5 VDC) at its charge contact point 155, then it enters into a second operational state by executing instructions included in block 172 in which the audio signal processing functionality 120 is enabled, the battery charge function 150 is enabled/controlled to initiate the battery charging process or cycle, the two-way radio link is enabled, the output from the battery 140 to the microphone power circuit is switched off, and the DC voltage received from the charger base is switched in. If the microphone does not detect a DC voltage level at the charge point 155, then it can enters a third operational state by executing the instructions included in block 173 in which the audio signal processing functionality 120 and a two-way radio link are enabled, and the switch 180 is controlled so that power to run the wireless microphone is received from the battery 140.

According to an embodiment of the invention, the first DC voltage level is regulated to approximately 4.8 Volts DC and the second DC voltage level is regulated to approximately 5.0 Volts DC. It should be understood, that the invention can operate if the values of the first and second DC voltage levels are not 5.0 and 4.8 DCV respectively. However, it is important that the microphone is able to discriminate between the two voltage levels in order to determine whether to control the microphone to enter into either the first or second operational states. Further, it is not important to the operation of the invention that the first DC voltage level is less than the second DC voltage level, or that it is less than the second DC voltage level by 0.2 volts DC. Accordingly, the first DC voltage level can be greater than the second DC voltage level, and the difference between each voltage level can be greater than 0.2 Volts DC.

Figure 3A:
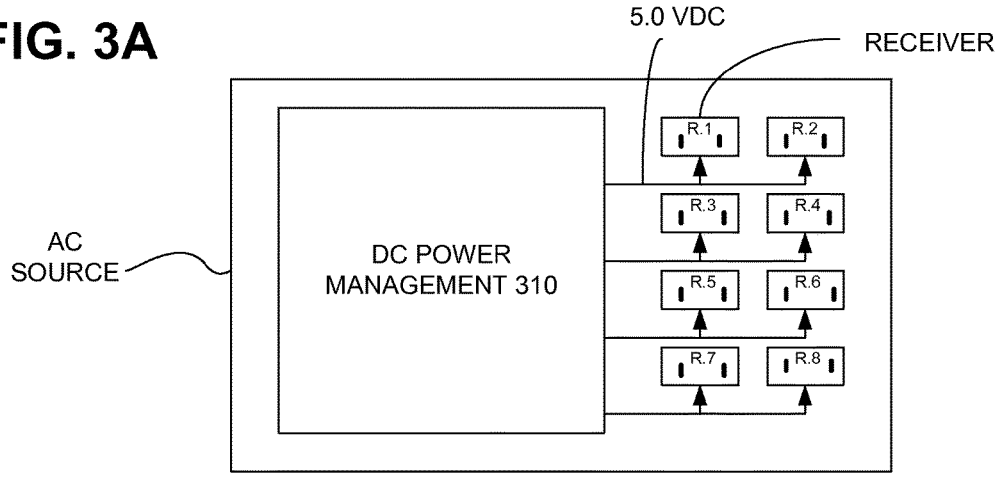
FIG. 3A illustrates physical elements comprising a standard wireless microphone charge base.
Figure 3B:
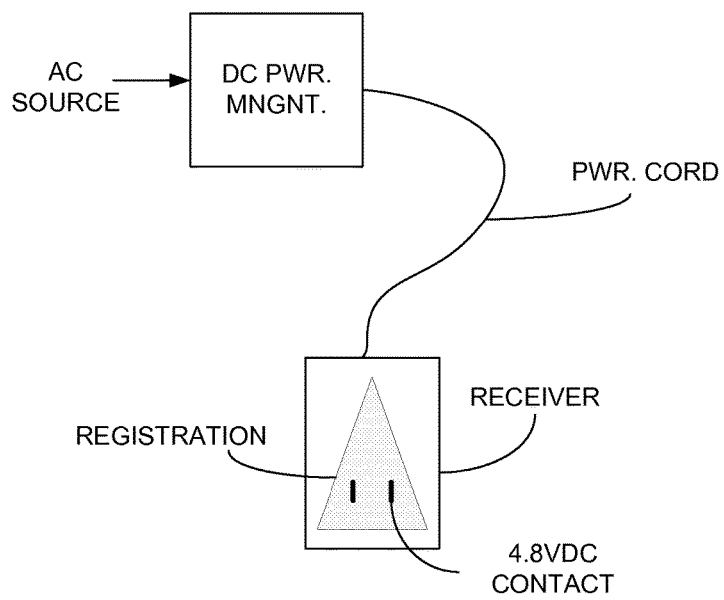
FIG. 3B illustrates physical elements comprising a hybrid wireless microphone charge base.

FIGS. 3A and 3B illustrate component parts comprising a standard charge base 300 and a hybrid charge base 310 respectively. The standard charge base 300 is designed to charge up to eight wireless microphones at one time, and one microphone can be placed into each one of eight receivers, R.1-R.8, shown in FIG. 3A to be charged. Each receiver has a pair of charge contacts that are designed to align with the charge contact points 155 comprising a wireless microphone and described earlier with reference to FIG. 1. The standard charge base only operates to apply a regulated voltage (4.8 VDC) to each wireless microphone placed into a receiver for as long as necessary to fully charge the microphones batteries. In contrast to the standard charge base 300 illustrated in FIG. 3A, each one of a plurality of wireless microphone receivers (only one is shown) is connected to a DC power management unit by a flexible power cord of any convenient length. The length of the cord connecting each receiver to the power management unit can be the same or different depending upon a number of factors. Regardless, each receiver comprising the hybrid charge base 310 has a male registration element that can include a magnet and, in this case, two charging contacts across which is placed a 5 DCV potential that is used by a microphone to charge it's batteries. The back of each wireless microphone includes a female registration element and some material that is attracted to the magnet in the male registration element. When placed on the receiver, the female registration element mates with the male mating element in a matter that orients the microphone charge contacts 155 with the receiver charge contacts, and the magnet in the receiver operates to maintain positive electrical contact between the microphone and the receiver while the microphone is being handled. The hybrid charge base 310 only operates to apply a DC voltage to each of the plurality of receivers.

The wireless microphone 100 operating state logic 170 will now be described in greater detail with reference to the flow diagram in FIG. 4. The operating state logic 170 is comprised of logical instructions that are implemented in computer readable code that when operated on by a computer processing device control the operation of the various microphone functions, such as the audio signal processing function 120, the battery charge function 150 and the switch 180. The logic 170 can be stored on a non-volatile storage device, such a ROM, or any other suitable storage device the contents of which are accessed by the processing device. The processing device in this case can be a digital signal processor (DSP) or any other appropriate computational device that is capable of operating on the logic 170. For the purpose of this description, it is assumed that the wireless microphone 100 is not initially connected to a battery charging source, and that the base station with which the wireless microphone is associated is not currently supporting an active audio session.

Prior to Step 1 in FIG. 4, the audio system with which the wireless microphone is associated is controlled to initiate an audio session. Prior to initiating the audio session, all, some, or none of a plurality of the wireless microphones associated with a base station comprising an audio system can be either connected to a charge base or not connected. Regardless, the wireless microphone battery voltage level detection function 160 in Step 1 either detects or does not detect a DC voltage level at the microphone contacts 155. If DC voltage is not detected at the contacts, then in Step 2 the logical 170 controls the microphone to transition to the third operational state or to remain in this state is the microphone is currently in the third state. During the time that the microphone is in the third operational state, the battery charge function 150 continually or periodically monitors the battery 140 charge level, and sends a signal to an appropriate charge level indicator (i.e., Red LED lit=Bat. Charge LO or Green LED lit=Bat. Charge O.K.) that displays to a user the charge state of the microphone. While in this operational state, the wireless microphone can be handled and moved around during use by a participant in the audio session without being tethered by a cord to an external source of power, and it functions to capture acoustic audio information and transmit this audio information in a microphone signal to the base station with which it is currently associated. In Step 3, if the logic determines that the battery charge level falls below a proper operating level, then in Step 4 wireless microphone becomes inoperative. At this point a participant in an audio session can, in Step 5, determine that they do not want to use or continue to use the microphone that became inoperative in Step 3, and in Step 6 the participant can connect the microphone to the standard charge base 300. Alternatively, if the session participant determines that they wish to continue using the wireless microphone that became inoperable in Step 3, they can connect the microphone to the hybrid charge base 310.

Returning to Step 1, if the voltage level detection function 160 detects a DC voltage level at the contacts 155, and if in Step 7 the DC voltage level detected in Step 1 is 4.8 VDC (standard charge base 300 voltage), then the logic 170 controls the microphone to transition to the first operational state in Step 8 and the logic uses the instructions 171 to charge the microphone's battery. On the other hand, if in Step 7 the voltage level detected is 5 VDC (Hybrid charge base 310 voltage), then the logic 170 controls the microphone to transition to the second operational state in Step 9, and the logic uses the instructions 172 to charge the microphone's battery but use the voltage supplied by the external power source to run the audio signal processor, the radio link or any other functionality needed to for the microphone to be fully functional. While connected to the hybrid charge base 310, the microphone can continue to be used by a participant in the session, but is tethered by a power cord to a DC voltage source.

The forgoing description, for purposes of explanation, used specific nomenclature to provide a thorough understanding of the invention. However, it will be apparent to one skilled in the art that specific details are not required in order to practice the invention. Thus, the forgoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

We claim:

1. A method for controlling the operational state of a wireless microphone, comprising:
   detecting by the wireless microphone that it is connected to an external DC voltage and measuring the external DC voltage to be either a first DC voltage level or a second DC voltage level that is different than the first DC voltage level, the first DC voltage level being generated by a first external DC voltage source and the second external DC voltage level being generated by a second external DC voltage source; and
   controlling the wireless microphone to transition to a first operational state if the measured DC voltage is equal to the first DC voltage level, to a second operational state if the measured DC voltage is equal to the second DC voltage level, and to a third operation state if external voltage level is not detected;
   wherein the first operational state is characterized by disabling an audio signal processing means and enabling a battery charge operation and a transceiver, and configuring the wireless microphone to operate using the first external power source; and
   wherein the second operational state is characterized by enabling the audio signal processing means, the battery charge operation and the transceiver, and configuring the wireless microphone to operate using the second external power source; and
   wherein the third operation state is characterized by enabling battery power operation, the audio signal processing means and the transceiver, and disabling the battery charger operation.

2. The method of claim 1, wherein the wireless microphone comprises operating logic implemented in computer instructions that when executed by a processor running on the wireless microphone cause the wireless microphone to transition to either the first, the second, or the third operational state.

3. The method of claim 1, wherein the wireless microphone is not tethered to any external device.

4. The method of claim 1, wherein the wireless microphone remains in the first operational state while it is connected to a standard battery charging device.

5. The method of claim 1, wherein the wireless microphone remains in the second operational state while it is connected to a hybrid charging device.

6. A wireless audio system, comprising:
   a first DC voltage source generating a first DC voltage level and a second DC voltage source generating a second DC voltage level that is different that the first DC voltage level; a
   loudspeaker;
   a base station; and
   at least one wireless microphone which is associated with the base stations the wireless microphone having an internal source of power and being configured to connect to either of the first or second DC voltage sources which are external to the wireless microphone; and
   controlling the wireless microphone to transition to a first operational state if the DC voltage is equal to the first DC voltage level, to a second operational state if the DC voltage is equal to the second DC voltage level, and to a third operation state if external voltage level is not detected;
   wherein the first operational state is characterized by disabling an audio signal processing means and a battery charge operation, enabling a transceiver, and configuring the wireless microphone to operate using the first external power source; and
   wherein the second operational state is characterized by enabling the audio signal processing means, the battery charge operation and the transceiver, and configuring the wireless microphone to operate using the second external power source,
   wherein the third operation state is characterized by enabling battery power operation, the audio signal processing means and the transceiver, and disabling the battery charger operation.

7. The wireless audio system of claim 6, wherein the wireless microphone is connected to a standard charge base device when in the first operational state.

* * * * *